US008853662B2

(12) United States Patent
BrightSky et al.

(10) Patent No.: US 8,853,662 B2
(45) Date of Patent: Oct. 7, 2014

(54) SELF-ALIGNED PROCESS TO FABRICATE A MEMORY CELL ARRAY WITH A SURROUNDING-GATE ACCESS TRANSISTOR

(71) Applicant: International Business Machines Corporation, Armonk, NY (US)

(72) Inventors: Matthew J. BrightSky, Pound Ridge, NY (US); Chung H. Lam, Peekskill, NY (US); Gen P. Lauer, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/076,267

(22) Filed: Nov. 11, 2013

(65) Prior Publication Data

US 2014/0061581 A1    Mar. 6, 2014

(51) Int. Cl.
*H01L 29/02* (2006.01)
*H01L 45/00* (2006.01)
*H01L 27/24* (2006.01)

(52) U.S. Cl.
CPC .............. *H01L 45/06* (2013.01); *H01L 45/143* (2013.01); *H01L 27/2454* (2013.01); *H01L 45/144* (2013.01)
USPC ........ 257/2; 257/3; 257/4; 257/5; 257/E29.02

(58) Field of Classification Search
CPC ......... H01L 45/04; H01L 29/00; H01L 27/24; G11C 13/0004
USPC .................. 257/2–5, E29.002; 438/102–104; 365/163
See application file for complete search history.

(56) References Cited

U.S. PATENT DOCUMENTS

| | | | |
|---|---|---|---|
| 6,096,601 A | 8/2000 | Itoh | 438/256 |
| 7,489,002 B2 | 2/2009 | Forbes et al. | 257/301 |
| 7,729,161 B2 | 6/2010 | Lung et al. | 365/163 |
| 2006/0097691 A1* | 5/2006 | Green | 320/107 |
| 2007/0228354 A1* | 10/2007 | Scheuerlein | 257/3 |
| 2008/0164452 A1* | 7/2008 | Joseph et al. | 257/3 |
| 2008/0283816 A1* | 11/2008 | Takaishi | 257/4 |
| 2009/0286368 A1 | 11/2009 | Lam et al. | 438/234 |
| 2010/0295121 A1 | 11/2010 | Ikebuchi | 257/329 |
| 2010/0295123 A1* | 11/2010 | Lung et al. | 257/334 |
| 2011/0001114 A1 | 1/2011 | Zanderighi et al. | 257/4 |

* cited by examiner

*Primary Examiner* — Jami M Valentine
(74) *Attorney, Agent, or Firm* — Ido Tuchman; Vazken Alexanian

(57) ABSTRACT

A memory array including a plurality of memory cells. Each word line is electrically coupled to a set of memory cells, a gate contact and a pair of dielectric pillars positioned parallel to the word line. Dielectric pillars are placed on both sides of the gate contact. Also a method to prevent a gate contact from electrically connecting to a source contact for a plurality of memory cells on a substrate. The method includes formation of a pair of pillars made of an insulating material over the substrate, depositing an electrically conductive gate material between and over the pillars, etching the gate material such that it both partially fills a space between the pair of pillars and forms a word line for the memory cells, and depositing a gate contact between the dielectric pillars such that the gate contact is in electrical contact with the gate material.

8 Claims, 8 Drawing Sheets

SELF-ALIGNED PROCESS TO FABRICATE A MEMORY CELL ARRAY WITH A SURROUNDING-GATE ACCESS TRANSISTOR

CROSS-REFERENCE TO RELATED APPLICATIONS

This application claims priority under 35 U.S.C. §120 to U.S. patent application Ser. No. 13/364,311 ("SELF-ALIGNED PROCESS TO FABRICATE A MEMORY CELL ARRAY WITH A SURROUNDING-GATE ACCESS TRANSISTOR") filed Feb. 1, 2012, the entire text of which is specifically incorporated by reference.

BACKGROUND

This invention relates to arrays of memory cells. Modern manufacturing techniques make it possible to pack more memory cells on a given area of substrate. Newer types of memory, such as Phase Change Memory cells, need a large amount of current to operate. This in turn has given rise to transistors, such as vertical access transistors, that allow for a large amount of current to be delivered to a relatively small area.

The confluence of high current densities and memory cells packed into relatively small areas has resulted in configurations and methods of manufacture that can accommodate them. One development has been the use of a self-alignment fabrication technique that allows structure to be formed on the substrate without photo resist masking. This allows for a tighter packing of cells than otherwise possible using traditional lithography techniques. However, such tightly packed memory arrays are susceptible to unintentional electrical shorting between the common-source contact and the word-line contact, thus rendering the memory array nonfunctional.

BRIEF SUMMARY

Accordingly, one example aspect of the present invention is a memory array that includes a plurality of memory cells, a word line electrically coupled to the memory cell and a word-line contact. A pair of dielectric pillars are positioned parallel to the word line, so that one of the pillars is located on one side of the word-line contact and the other electric pillar is located on the other side of the word-line contact.

Another example of the present invention is a method to prevent a word-line contact from electrically connecting to a source contact for a plurality of memory cells on a substrate. The method includes forming a pair of pillars made of an insulating material over the substrate. A deposition step deposits an electrically conductive gate material between and over the pillars. An etching step etches the gate material such that the gate material partially fills the space between the neighboring pillars in the word-line direction while the gate material. In this manner, the gate material forms a word line for the memory cells. Each word line is separated from its neighboring word-line due to the larger space between pillars in the bit-line direction than in the word-line direction. A depositing step deposits a gate contact between the pair of pillars such that the gate contact is in electrical contact with the gate material.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
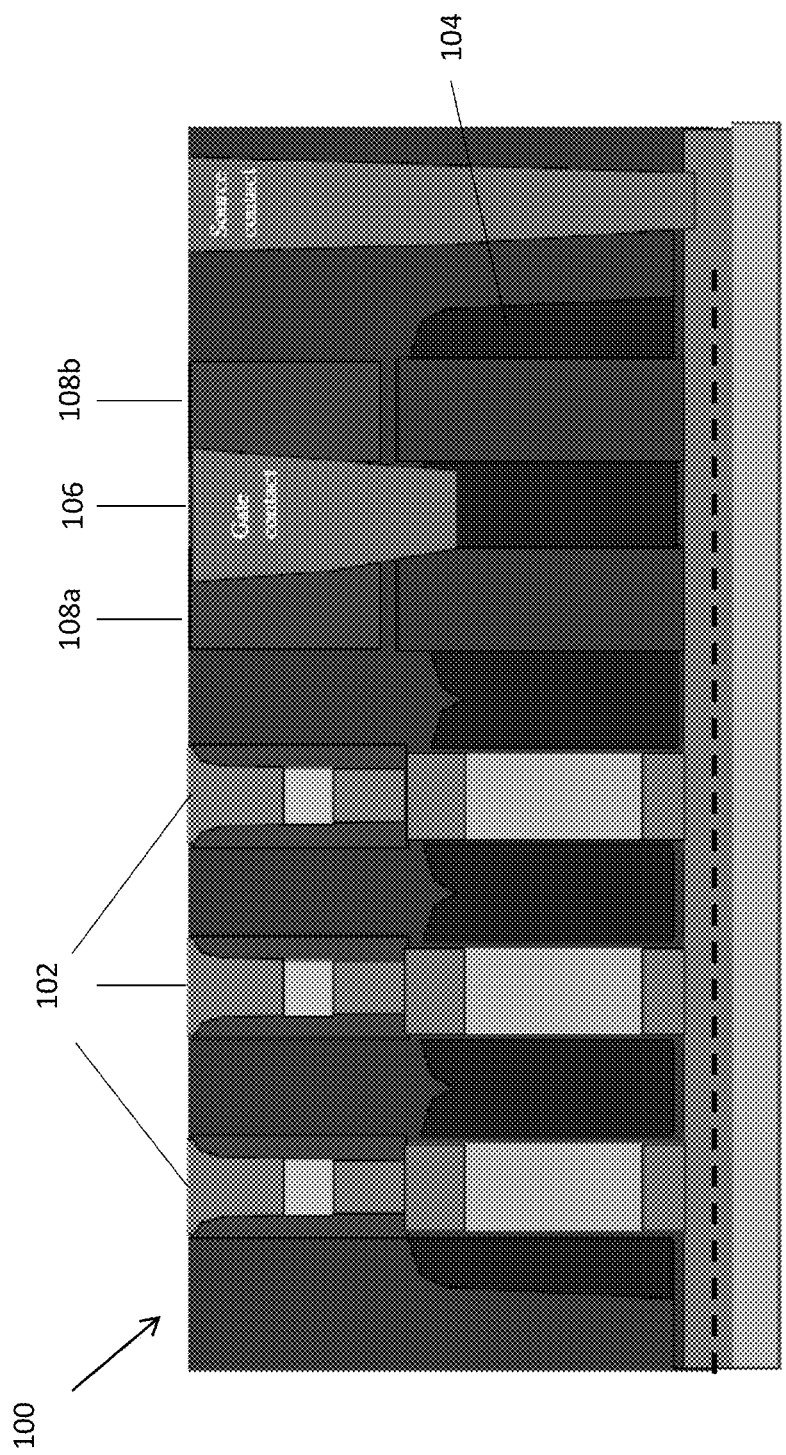
FIG. 1 shows a memory array in accordance with one embodiment of the present invention. The figure is a cutaway view along a word line, showing a plurality of memory cells, a word-line contact and a source contact.

The present invention is described with reference to embodiments of the invention. Throughout the description of the invention reference is made to FIGS. 1-8. When referring to the figures, like structures and elements shown throughout are indicated with like reference numerals.

FIG. 1 shows a memory array in accordance with one embodiment of the present invention. In this embodiment, a memory array 100 has a plurality of memory cells 102 and a word line 104 electrically coupled to the plurality of memory cells 102 and a word-line contact 106, also referred herein as a gate contact. Further, a pair of dielectric pillars 108a and 108b is positioned parallel to the word line 104.

Figure 2:
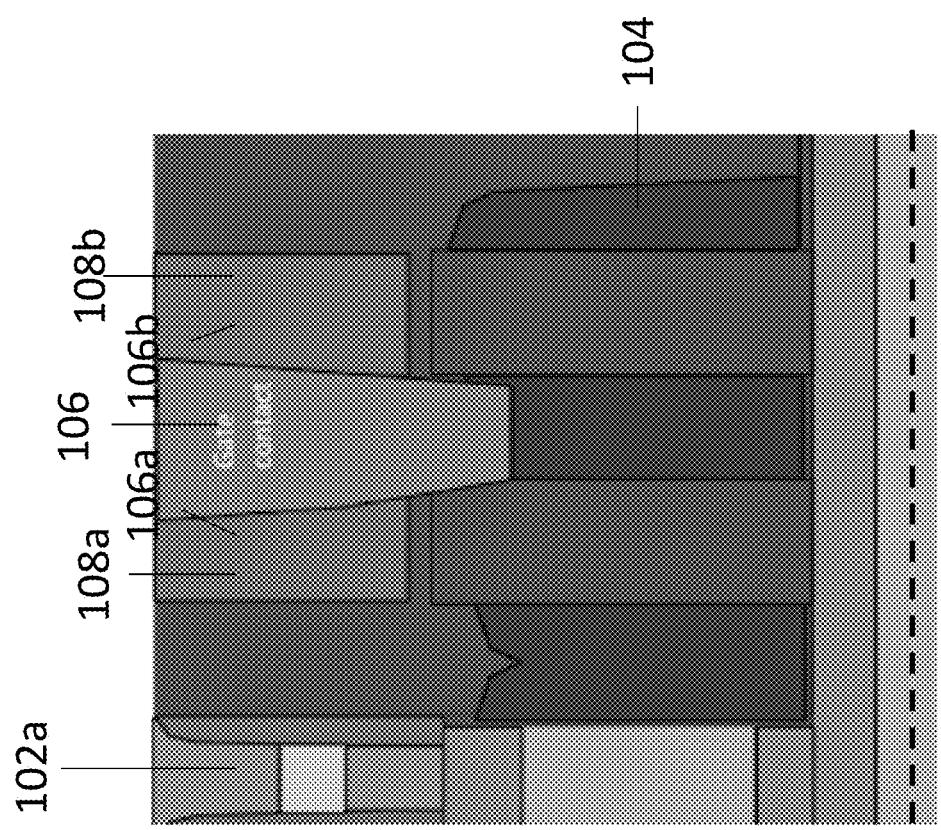
FIG. 2 is a magnified view of a pair of dielectric pillars around the gate contact.

FIG. 2 is a closer view of the pair of dielectric pillars around the gate contact in one embodiment of the present invention. A first pillar 108a of the pair of dielectric pillars 108a and 108b is disposed on a first side 106a of the word-line contact 106 and a second pillar 108b of the pair of dielectric pillars 108a and 108b is disposed on a second side 106b of the gate contact 106. In one embodiment of the present invention, the pair of dielectric pillars 108a and 108b consists entirely of silicon dioxide.

Figure 3:
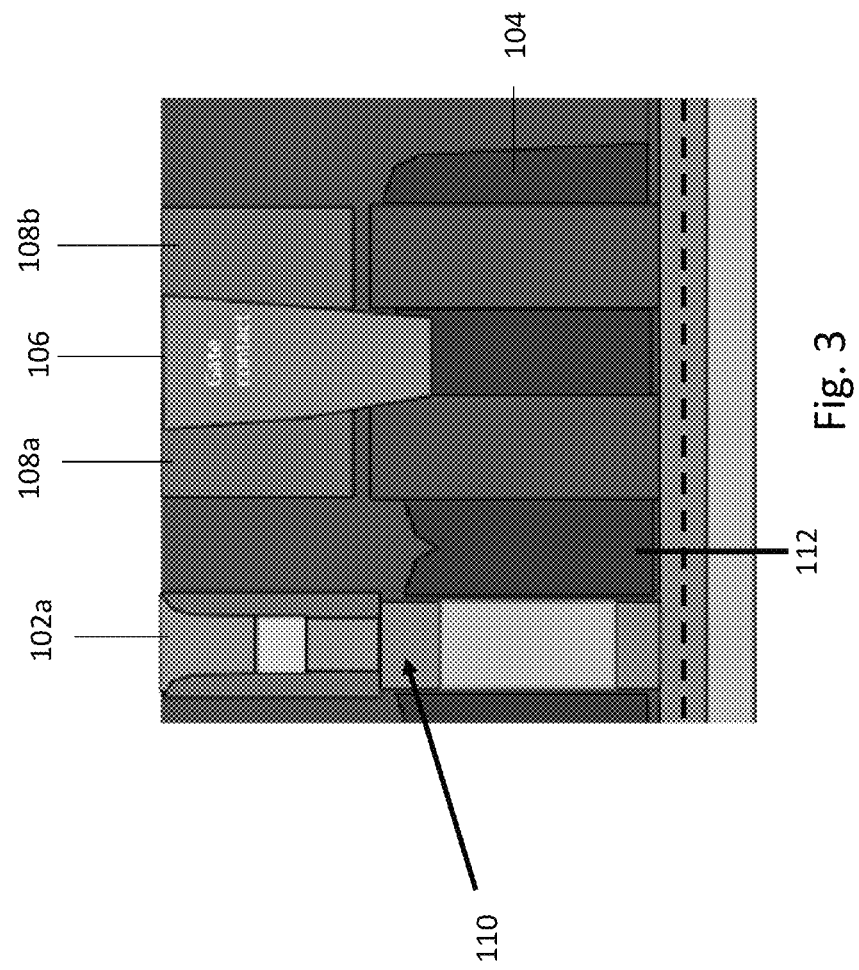
FIG. 3 is a magnified view of an electrical coupling between one of the plurality of memory cells to the word-line contact.
Figure 4:
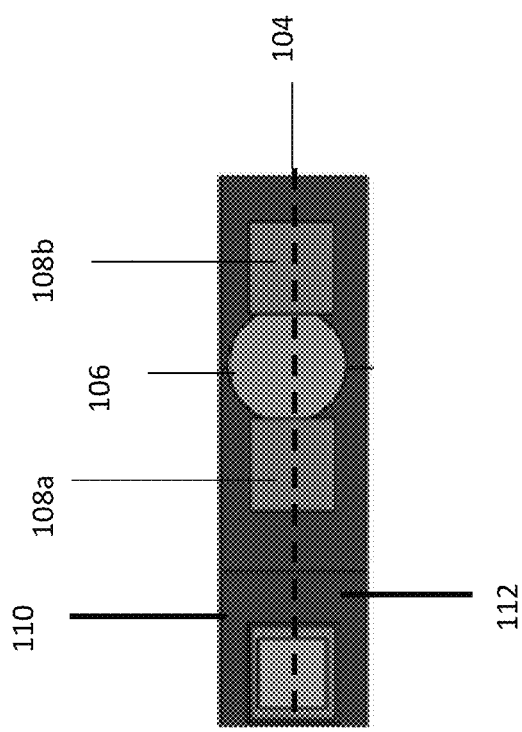
FIG. 4 is an elevation view of the same region as in FIG. 3.

FIG. 3 is a closer view of the electrical coupling of a memory cell to the word-line contact in one embodiment of the present invention. FIG. 4 is an elevation view of FIG. 3. Referring to FIGS. 3 and 4, a memory cell 102a in the plurality of memory cells 102 may include a vertical access transistor 110. Each vertical access transistor 110 includes a gate terminal 112 electrically coupled to the word-line contact 106. The memory cells 102 may be resistive memory, such as MRAM. In one embodiment of the invention, the memory cells 102 are phase change memory cells. The phase change memory cells may include $Ge_2Sb_2Te_5$. The phase change memory cells may include $Sb_xTe_{1-x}$ material, where $0.4\ (Sb_2Te_3) <= x <= 0.7\ (Sb_7Te_3)$. The phase change memory cells may include $In_2Se_3$. The vertical access transistor may be a vertical surrounding-gate transistor with a channel diameter of one lithographic size feature.

Figure 5:
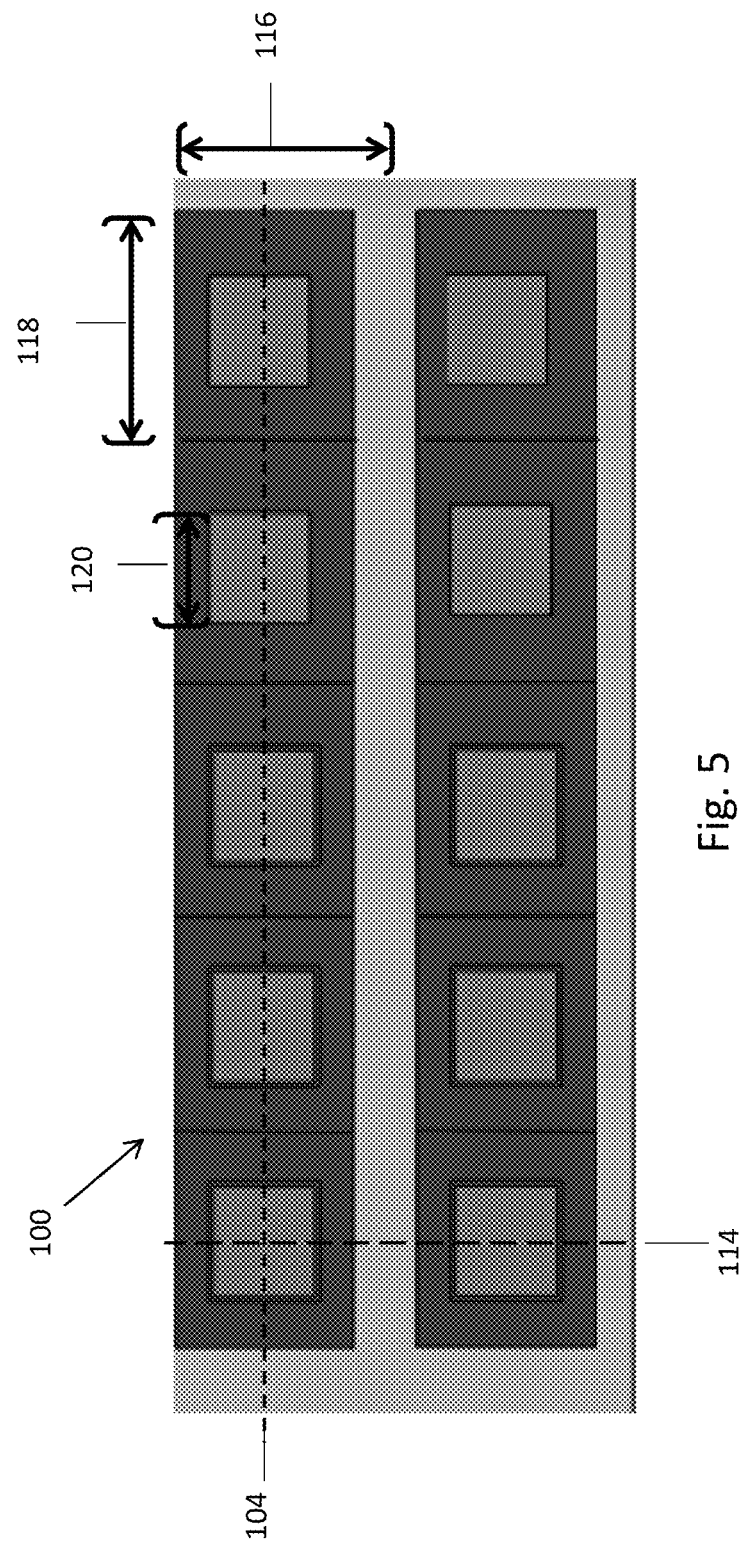
FIG. 5 is an elevation view of the memory array before the gate contact is deposited. This view illustrates relative linear dimensions of word and bit lines.

FIG. 5 is a schematic drawing of an elevation view of one embodiment of the present invention, showing the memory array 100 before the gate contact 106 (see FIG. 4) is deposited. Referring to FIG. 4, the memory array 100 includes a plurality of bit lines 114. Each of the bit lines 114 is electrically coupled to one of the plurality of memory cells 102. The bit lines 114 have a pitch 118 of at least one lithographic feature size 120 less than the pitch 116 of the word line 104. In another embodiment of the present invention, the bit lines 114 have a pitch 118 of two lithographic feature sizes 120, and each word line 104 has a pitch 116 of three lithographic feature sizes 120.

Figure 6:
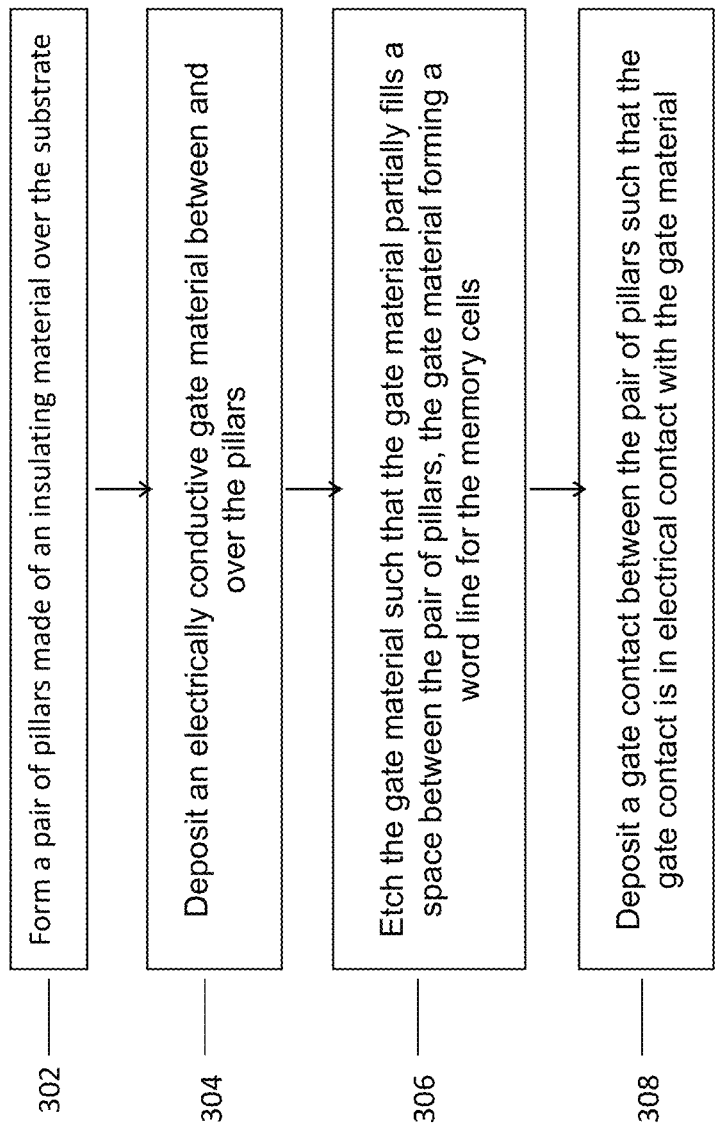
FIG. 6 shows a method to prevent a word-line contact from electrically connecting to a source contact for a plurality of memory cells on a substrate, in accordance with one embodiment of the present invention.

FIG. 6 shows a method to prevent a word-line contact from electrically connecting to a source contact for a plurality of memory cells on a substrate, in accordance with one embodiment of the present invention. The memory cells may be phase change memory cells. The memory cells may be comprised of vertical access transistors. One embodiment of the method is a self-aligned integration scheme to build a high-density phase-memory cell with an area of six square lithographic feature sizes ($6F^2$) utilizing a vertical transistor as the access transistor. A channel for the vertical access transistor may be formed by silicon pillar etching, which is achieved by etching lines first and then etching lines orthogonal to them. The memory cell may be self-aligned to the drain of the access transistor.

The method includes a formation step 302. During the formation step 302, a pair of pillars made of an insulating material are formed over the substrate. The insulating material may be silicon dioxide. After the formation step 302 is completed, the next step is a deposition step 304.

During the deposition step 304, an electrically conductive gate material is deposited between and over the pillars. In one embodiment, the conductive gate material is polysilicon. After the deposition step 304 is completed, the next step is an etching step 306.

During the etching step 306, the gate material is etched such that the gate material partially fills a space between the pair of pillars, the gate material forming a word line for the memory cells. After the etching step 306 is completed, the next step is a deposition step 308. During the deposition step 308, a gate contact is deposited between the pair of pillars such that the gate contact is in electrical contact with the gate material.

Figure 7:
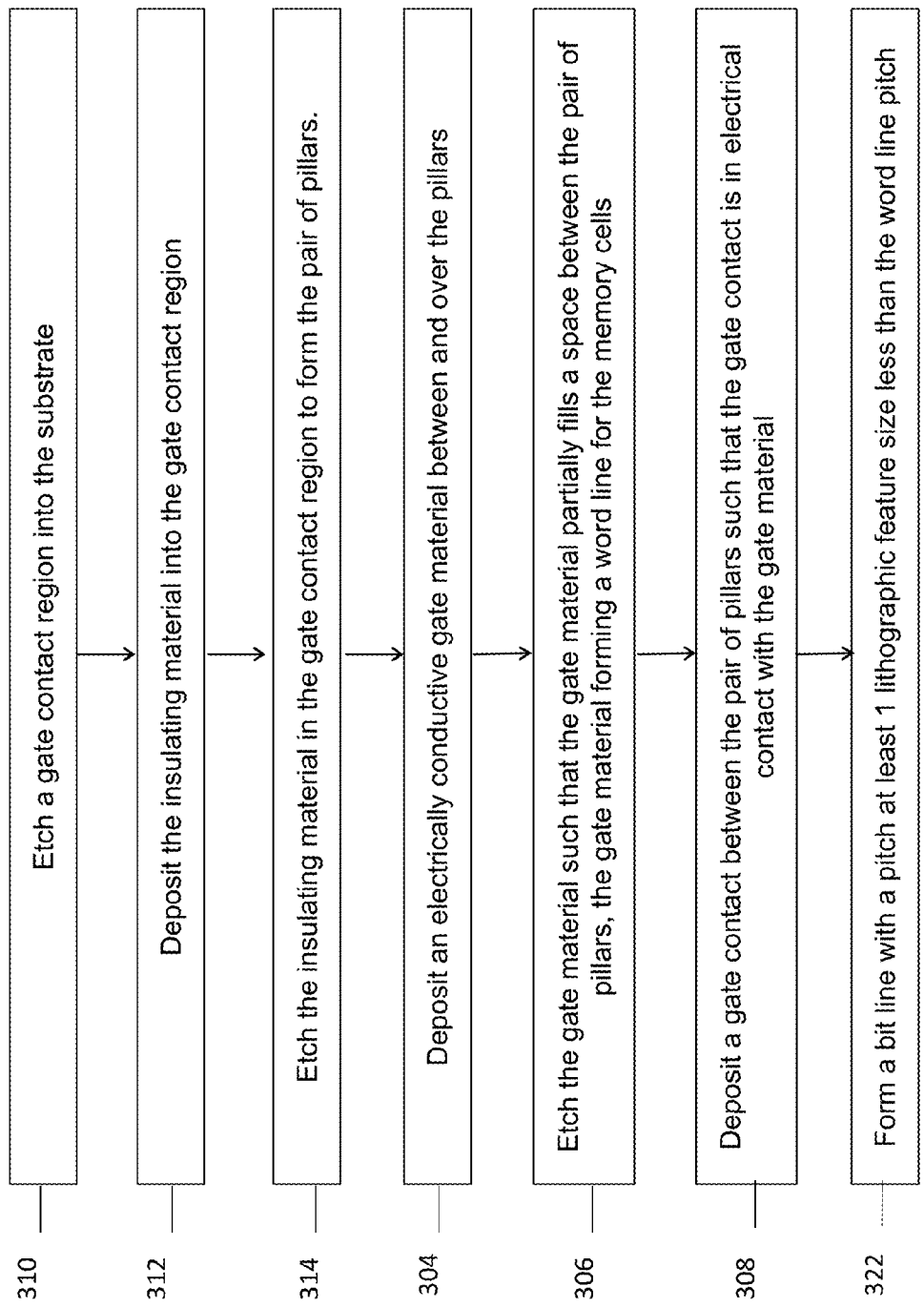
FIG. 7 shows an alternate embodiment of method to prevent a word-line contact from electrically connecting to a source contact for a plurality of memory cells on a substrate.

FIG. 7 shows an alternate embodiment of a method to prevent a gate contact from electrically connecting to a source contact for a plurality of memory cells on a substrate, in accordance with one embodiment of the present invention. The memory cells may be phase change memory cells. The memory cells may be comprised of vertical access transistors.

The method includes an etching step 310. In the etching step 310 a gate contact region is etched into the substrate. The gate contact region may be filled with oxide trenches, which are etched into oxide pillars with the same mask used for etching the pillars. The pillars may be silicon pillars. In one embodiment of the invention the wordline contact, also known herein as the gate contact, is formed between dummy silicon dioxide pillars. After the etching step 310 is completed, the next step is a deposition step 312.

In the deposition step 312, the insulating material is deposited into the gate contact region. After the deposition step 312 is completed, the next step is an etching step 314. In the etching step 314, the insulating material is etched in the gate contact region to form a pair of pillars. The insulating material may be silicon dioxide. After the etching step 314 is completed, the next step is a deposition step 304.

During the deposition step 304, an electrically conductive gate material is deposited between and over the pillars. After the deposition step 304 is completed, the next step is an etching step 306.

During the etching step 306, the gate material is etched such that the gate material partially fills a space between the pair of pillars, the gate material forming a word line for the memory cells. After the etching step 306 is completed, the next step is a deposition step 308.

During the deposition step 308, a gate contact is deposited between the pair of pillars such that the gate contact is in electrical contact with the gate material. After the deposition step 308 is completed, the next step is a formation step 322.

During the formation step 322, a bit line is formed. In one embodiment of the present invention, the word line has a pitch of 3 lithographic feature sizes and the bit line is formed with a pitch of 2 lithographic feature sizes.

Figure 8:
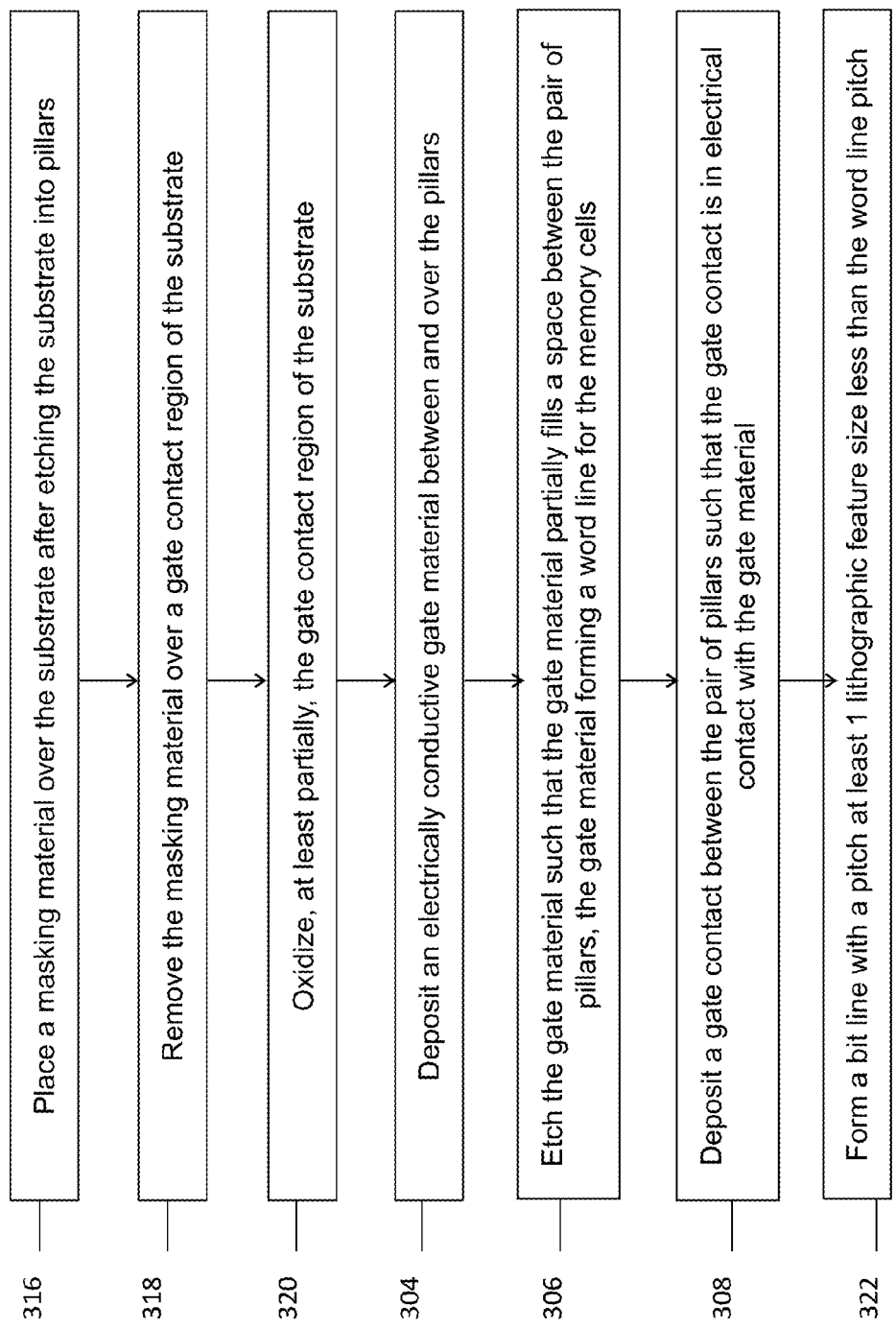
FIG. 8 shows an alternate embodiment of method to prevent a word-line contact from electrically connecting to a source contact for a plurality of memory cells on a substrate.

FIG. 8 shows an alternate embodiment of a method to prevent a gate contact from electrically connecting to a source contact for a plurality of memory cells on a substrate, in accordance with one embodiment of the present invention. The memory cells may be phase change memory cells. The memory cells may be comprised of vertical access transistors.

The method includes a placement step 316. During the placement step 316, a masking material is placed over the substrate. Various masking materials known to those skilled in the art may be used during this step. After the placement step 316 is completed, the next step is a removal step 318.

During the removal step 318, the masking material is removed over a gate contact region of the substrate. After the removal step 318 is completed, the next step is an oxidation step 320.

During the oxidation step 320, the gate contact region of the substrate is oxidized, at least partially, to form the pair of pillars. In another embodiment of the present invention, the gate contact region may be fully oxidized. The oxidized material may be silicon dioxide. After the oxidizing step 320 is completed, the next step is a deposition step 304.

During the deposition step 304, an electrically conductive gate material is deposited between and over the pillars. After the deposition step 304 is completed, the next step is an etching step 306.

During the etching step 306, the gate material is etched such that the gate material partially fills a space between the pair of pillars, the gate material forming a word line for the memory cells. After the etching step 306 is completed, the next step is a deposition step 308.

During the deposition step 308, a gate contact is deposited between the pair of pillars such that the gate contact is in electrical contact with the gate material. After the deposition step 308 is completed, the next step is a formation step 322.

During the formation step 322, a bit line is formed. In one embodiment of the present invention, the word line has a pitch of 3 lithographic feature sizes and the bit line is formed with a pitch of 2 lithographic feature sizes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory array comprising:
 a plurality of memory cells;
 a word line electrically coupled to the memory cell and a gate contact; and
 a pair of dielectric pillars positioned parallel to the word line, wherein a first pillar of the pair of dielectric pillars is disposed on a first side of the gate contact and a second pillar of the pair of dielectric pillars is disposed on a second side of the gate contact; and
 wherein the bit lines have a pitch of two lithographic feature sizes, and the word line have a pitch of three lithographic feature sizes.

2. A memory array as in claim 1, wherein the pair of dielectric pillars consist entirely of silicon dioxide.

3. A memory array as in claim 2, wherein each of the plurality of memory cells includes a vertical access transistor, the vertical access transistor includes a gate terminal electrically coupled to the word line and the gate contact.

4. A memory array as in claim 3, wherein the plurality of memory cells are phase change memory cells.

5. The memory array as in claim 4, wherein the memory cells include Ge2Sb2Te5.

6. The memory array as in claim 4, wherein the memory cells include SbTe materials.

7. The memory array as in claim 4, wherein the memory cells include In2Se3.

8. A memory array as in claim 1, further comprising a plurality of bit lines, each of the bit lines is electrically coupled to one of the memory cells.

* * * * *